(12) United States Patent
Thomsen (10) Patent No.: US 8,541,792 B2
(45) Date of Patent: Sep. 24, 2013

(54) METHOD OF TREATING THE SURFACE OF A SODA LIME SILICA GLASS SUBSTRATE, SURFACE-TREATED GLASS SUBSTRATE, AND DEVICE INCORPORATING THE SAME

(75) Inventor: Scott V. Thomsen, South Lyon, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 225 days.

(21) Appl. No.: 12/923,952

(22) Filed: Oct. 15, 2010

(65) Prior Publication Data
US 2012/0091475 A1    Apr. 19, 2012

(51) Int. Cl.
*H01L 29/18* (2006.01)

(52) U.S. Cl.
USPC .................. 257/88; 257/E21.214; 438/30

(58) Field of Classification Search
USPC .............. 257/88, E21.214, E33.053, E33.06; 438/30, 758; 204/192.11; 359/885
See application file for complete search history.

(56) References Cited

U.S. PATENT DOCUMENTS

| | | |
|---|---|---|
| 5,508,368 A | 4/1996 | Knapp et al. |
| 5,598,285 A | 1/1997 | Kondo et al. |
| 5,601,966 A | 2/1997 | Kumar et al. |
| 5,614,353 A | 3/1997 | Kumar et al. |
| 5,652,083 A | 7/1997 | Kumar et al. |
| 5,838,037 A | 11/1998 | Masutani et al. |
| 5,888,593 A | 3/1999 | Petrmichl et al. |
| 5,926,702 A | 7/1999 | Kwon et al. |
| 6,016,178 A | 1/2000 | Kataoka et al. |
| 6,356,335 B1 | 3/2002 | Kim et al. |
| 6,362,028 B1 | 3/2002 | Chen et al. |
| 6,368,664 B1 | 4/2002 | Veerasamy et al. |
| 6,580,093 B2 | 6/2003 | Chung et al. |
| 6,602,371 B2 | 8/2003 | Veerasamy |
| 6,610,360 B2 | 8/2003 | Petrmichl et al. |
| 6,740,211 B2 | 5/2004 | Thomsen et al. |
| 6,777,030 B2 | 8/2004 | Veerasamy et al. |
| 6,808,606 B2 | 10/2004 | Thomsen et al. |
| 6,815,690 B2 | 11/2004 | Veerasamy et al. |
| 6,827,977 B2 | 12/2004 | Veerasamy |
| 6,884,569 B2 | 4/2005 | Nakashima et al. |

(Continued)

FOREIGN PATENT DOCUMENTS

EP    0 207 646    1/1987

OTHER PUBLICATIONS

U.S. Appl. No. 12/461,130, filed Jul. 31, 2009; Schloremberg et al.
U.S. Appl. No. 12/385,318, filed Apr. 3, 2009; Fulton et al.

*Primary Examiner* — Vongsavanh Sengdara
(74) *Attorney, Agent, or Firm* — Nixon & Vanderhye P.C.

(57) ABSTRACT

Certain example embodiments of this invention relate to methods of treating the surface of a soda lime silica glass substrate, e.g., a soda lime silica alkali ion glass substrate, and the resulting surface-treated glass articles. More particularly, certain example embodiments of this invention relate to methods of removing a top surface portion of a glass substrate using ion sources. During or after removal of this portion, the glass may then be coated with another layer, to be used as a capping layer. In certain example embodiments, the glass substrate coated with a capping layer may be used as a color filter and/or TFT substrate in an electronic device. In other example embodiments, the glass substrate with the capping layer thereon may be used in a variety of display devices.

14 Claims, 5 Drawing Sheets

(56) References Cited

U.S. PATENT DOCUMENTS

| | | |
|---|---|---|
| 7,030,390 B2 | 4/2006 | Veerasamy et al. |
| 7,049,003 B2 | 5/2006 | Thomsen et al. |
| 7,071,036 B2 | 7/2006 | Yang |
| 7,183,559 B2 | 2/2007 | Luten et al. |
| 7,198,699 B2 | 4/2007 | Thomsen et al. |
| 7,229,533 B2 | 6/2007 | Veerasamy |
| 7,311,975 B2 | 12/2007 | Butz et al. |
| 7,387,816 B2 | 6/2008 | Thomsen et al. |
| 7,405,411 B2 | 7/2008 | Walton |
| 7,405,852 B2 | 7/2008 | Brosnihan et al. |
| 7,408,606 B2 | 8/2008 | Shih |
| 7,445,273 B2 | 11/2008 | Veerasamy et al. |
| 7,507,442 B2 | 3/2009 | Veerasamy |
| 7,537,801 B2 | 5/2009 | Veerasamy et al. |
| 7,550,067 B2 | 6/2009 | Veerasamy |
| 7,563,347 B2 | 7/2009 | Kriltz et al. |
| 7,566,481 B2 | 7/2009 | Veerasamy |
| 7,585,396 B2 | 9/2009 | Veerasamy |
| 7,589,799 B2 | 9/2009 | Lai |
| 7,602,360 B2 | 10/2009 | Park |
| 7,622,161 B2 | 11/2009 | Veerasamy |
| 7,641,978 B2 | 1/2010 | Veerasamy |
| 2002/0081378 A1* | 6/2002 | Veerasamy et al. ............ 427/165 |
| 2004/0020761 A1 | 2/2004 | Thomsen et al. |
| 2004/0086785 A1* | 5/2004 | Lin .................... 430/5 |
| 2005/0178652 A1 | 8/2005 | Murphy et al. |
| 2006/0003545 A1* | 1/2006 | Veerasamy .................... 438/428 |
| 2006/0169316 A1 | 8/2006 | Thomsen et al. |
| 2006/0249199 A1 | 11/2006 | Thomsen et al. |
| 2006/0249376 A1 | 11/2006 | Walton |
| 2006/0269661 A1 | 11/2006 | Butz et al. |
| 2007/0215205 A1 | 9/2007 | Thomsen et al. |
| 2008/0226926 A1 | 9/2008 | Thomsen et al. |
| 2009/0115955 A1* | 5/2009 | Lee et al. ..................... 349/160 |
| 2009/0217978 A1 | 9/2009 | Thomsen et al. |
| 2009/0223252 A1 | 9/2009 | Fulton et al. |
| 2009/0226714 A1 | 9/2009 | Veerasamy |
| 2009/0237609 A1* | 9/2009 | Lee ........................... 349/158 |
| 2009/0263667 A1 | 10/2009 | Veerasamy |
| 2009/0280587 A1 | 11/2009 | Whangbo et al. |
| 2010/0032287 A1 | 2/2010 | Veerasamy |
| 2010/0066519 A1* | 3/2010 | Baur et al. .................... 340/435 |
| 2010/0075155 A1 | 3/2010 | Veerasamy |
| 2010/0075157 A1 | 3/2010 | Petrmichl et al. |
| 2010/0122728 A1 | 5/2010 | Fulton et al. |

* cited by examiner

METHOD OF TREATING THE SURFACE OF A SODA LIME SILICA GLASS SUBSTRATE, SURFACE-TREATED GLASS SUBSTRATE, AND DEVICE INCORPORATING THE SAME

FIELD OF THE INVENTION

Certain example embodiments of this invention relate to methods of treating the surface of a soda lime silica glass substrate, e.g., a soda lime silica alkali ion glass substrate, and the resulting surface-treated glass substrates. More particularly, certain example embodiments of this invention relate to methods of removing a surface portion of a glass substrate. In certain example embodiments, a surface portion of a glass substrate is removed by milling; using high energy ion sources to remove the top portion of a surface of a glass substrate. After or during removal of this portion, the glass may then be coated with another layer, to be used as a capping layer. In certain example embodiments, the capping layer is deposited over the milled/planed portion of the glass substrate via ion beam assisted deposition (IBAD). In certain example embodiments, the glass substrate coated with a capping layer may be used as a color filter and/or TFT substrate in an LCD device. In other example embodiments, the glass substrate with the capping layer thereon may be used in a variety of display devices.

BACKGROUND AND SUMMARY OF EXAMPLE EMBODIMENTS OF THE INVENTION

Display devices are known in the art. Display devices include, for example, LCD devices, plasma devices, OLED devices, and the like. Applications of these display devices include TVs, monitors, notebooks, professional displays, cell phones, portable game systems, other handheld devices, and the like.

Figure 1:
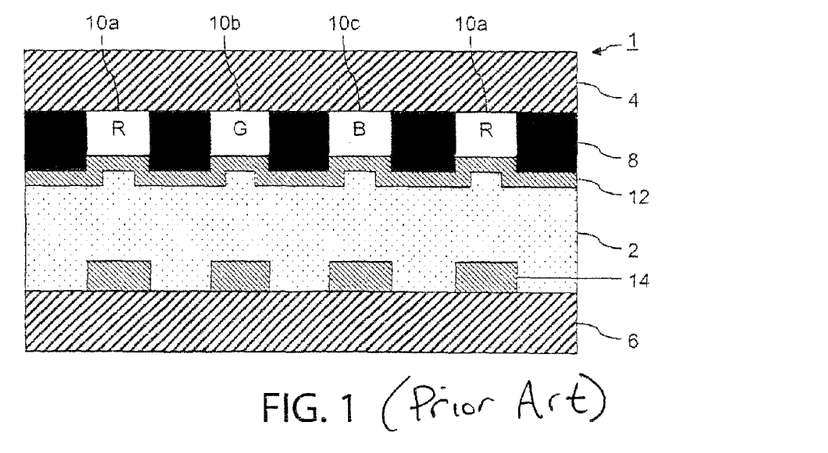
FIG. 1 is a cross-sectional view of a typical LCD display device.

Display devices generally include one or more glass substrates. For example, FIG. 1 is a cross-sectional view of a typical LCD display device 1. For examples of LCD devices, see U.S. Pat. Nos. 7,602,360; 7,408,606; 6,356,335; 6,016,178; and 5,598,285, each of which is hereby incorporated herein in its entirety. The display device 1 generally includes a layer of liquid crystal material 2 sandwiched between first and second substrates 4 and 6, and the first and second substrates 4 and 6 typically are borosilicate glass substrates. The first substrate 4 often is referred to as the color filter substrate, and the second substrate 6 often is referred to as the active or TFT substrate.

The first or color filter substrate 4 typically has a black matrix 8 formed thereon, e.g., for enhancing the color quality of the display. To form the black matrix, a polymer, acrylic, polyimide, metal, or other suitable base may be disposed as a blanket layer and subsequently patterned using photolithography or the like. Individual color filters 10 are disposed in the holes formed in the black matrix. Typically, the individual color filters comprise red 10a, green 10b, and blue 10c color filters, although other colors may be used in place of or in addition to such elements. The individual color filters may be formed photolithographically, by inkjet technology, or by other suitable technique. A common electrode 12, typically formed from indium tin oxide (ITO) or other suitable conductive material, is formed across substantially the entirety of the substrate or over the black matrix 12 and the individual color filters 10a, 10b, and 10c.

The second or TFT substrate 6 has an array of TFTs 14 formed thereon. These TFTs are selectively actuatable by drive electronics (not shown) to control the functioning of the liquid crystal light valves in the layer of liquid crystal material 2. TFT substrates and the TFT arrays formed thereon are described, for example, in U.S. Pat. Nos. 7,589,799; 7,071,036; 6,884,569; 6,580,093; 6,362,028; 5,926,702; and 5,838,037, each of which is hereby incorporated herein in its entirety.

Although not shown in FIG. 1, a light source, one or more polarizers, alignment layers, and/or the like may be included in a typical LCD display device.

Display devices such as that shown in FIG. 1 generally include borosilicate glass as the glass substrates (e.g., substrates 4 and 6 in FIG. 1 generally are of borosilicate glass). In certain example embodiments, these glass substrates made be used in connection with thin film transistors (TFT) or color filters. Traditionally, borosilicate glass must be used as the glass substrate(s) in display devices to maintain the quality of the overall display devices. For instance, it will be appreciated that the high temperatures involved in current techniques for manufacturing display devices restrict the types of materials that can be used as the substrates (e.g., in ITO deposition for the common electrode, in the TFT array manufacturing processes, etc.).

However, borosilicate glass is expensive, and it will be appreciated that in certain instances it may be desirable to use more cost-effective glass substrate(s) in certain display devices without comprising the quality of the device.

Unfortunately, when soda lime silica glass (which is a less expensive glass than borosilicate glass, but contains more alkali/alkaline ions) is exposed to the high temperatures necessary for manufacturing display devices, the alkali and/or alkaline ions including sodium and/or other contaminants often migrate outward from soda lime silica glass substrate into the coating and/or other locations in the display device. These ions and/or contaminants may have a negative effect on the durability and quality of the overall display device.

Thus, it will be appreciated that there is a need in the art for improved coated articles to be used in display and/or other products, and/or methods of making the same. For example, it will be appreciated that it would be advantageous to replace borosilicate glass with soda lime silica glass in LCD and/or other flat panel applications.

One aspect of certain example embodiments relates to techniques for treating a soda lime silica glass substrate such that it can be used in a display device such as an LCD, plasma, and/or OLED devices without compromising the quality or durability of the device.

Another aspect of certain example embodiments relates to using these treated glass substrates in display devices.

Certain example embodiments of this invention relate to a method of making a coated article. A glass substrate comprising from about 67-75% $SiO_2$, about 6-20% $Na_2O$, and about 5-15% CaO is provided. Ion beam milling (which includes planing and/or the like) is performed on substantially an entire surface of the substrate using at least a first ion source, so as to reduce the thickness of the substrate by at least about 100 Angstroms. At least one layer comprising $AlSiO_x$ is formed via ion beam assisted deposition (IBAD), on at least a portion of the ion beam milled surface of the substrate during or following said ion beam milling, wherein said IBAD uses at least one sputtering target and at least a second ion source.

According to certain example embodiments, an electronic display device may be made. First and second coated articles may be according to this or a similar method of claim 1. A TFT substrate may be made using the first coated article as a base thereof. A TFT substrate may be made using the second coated article as a base thereof. A layer of liquid crystal material may be disposed between the color filter substrate and the TFT substrate. Of course, in certain example instances, method may be used for one or both of the TFT substrate and the color filter substrate.

Certain example embodiments of this invention relate to a method of making an electronic device. The method comprises ion beam milling, in an Ar and O2 inclusive environment, substantially an entire surface of a glass substrate using a plurality of first ion sources, so as to reduce the thickness of the substrate by at least about 150 Angstroms; forming at least one silicon-inclusive capping layer via ion beam assisted deposition (IBAD) on at least a portion of the ion beam planed or milled surface of the substrate following said ion beam milling; and building the substrate, once planed or milled and having the silicon-inclusive capping layer formed thereon, into the electronic device. The IBAD is performed in an Ar and $O_2$ inclusive environment and involves plural sputtering targets, each said sputtering target having a respective second ion source associated therewith.

Certain example embodiments of this invention also relate to an electronic device including a TFT and/or a color filter substrate. The TFT and/or color filter substrate comprises a glass substrate, a surface portion of the soda lime silica glass substrate having been planed or milled to remove at least about 150 Angstroms; and an ion beam assisted-deposited layer of or including $AlSiO_x$ located over and contacting the milled surface portion of the glass substrate, the layer comprising $AlSiO_x$ having a refractive index less than or equal to 1.55 and an optical extinction coefficient k of about 0, the $AlSiO_x$ being 200-300 Angstroms thick.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments relate to methods for treating the surface of certain types of glass in order to render the glass more suitable for use in a display device. Certain example embodiments relate to surface-treated glass articles suitable for use in display devices, e.g. as color filter and/or TFT substrates. In certain example embodiments, soda lime silica glass may be milled and/or planed using at least one ion source, and a capping layer comprising aluminum silicon oxide (e.g., $AlSiO_x$) may be deposited over at least part of the milled/planed portion of the soda lime silica glass substrate. In certain embodiments, the deposition of $AlSiO_x$ is performed using ion beam assisted deposition (IBAD). Certain example embodiments of this invention relate to both the method for treating the surface of the glass substrate, as well as the corresponding surface-treated glass article.

Figure 2A:
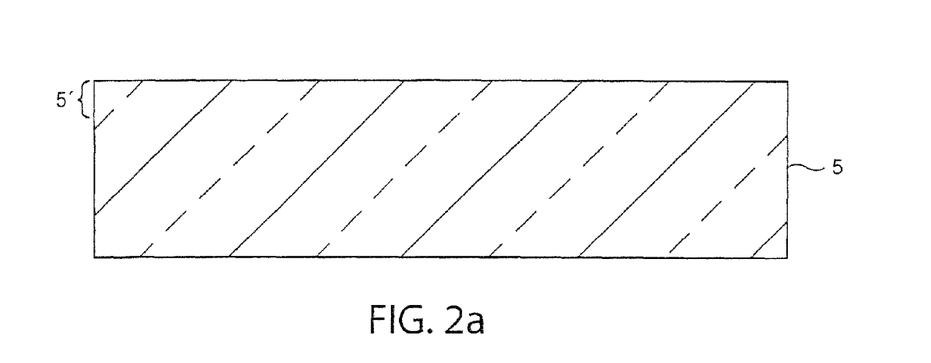
FIG. 2a is a cross-sectional view of a typical soda lime silica glass substrate, including a contaminated, uppermost portion, according to certain example embodiments.
Figure 3A:
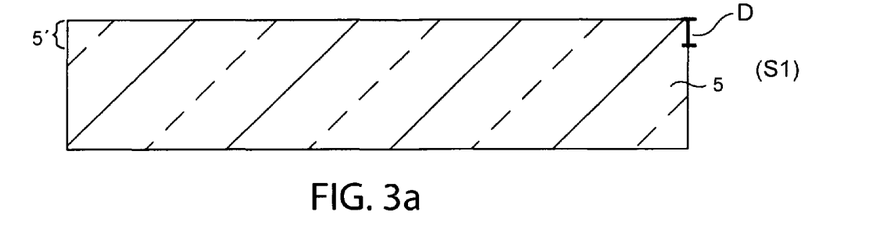
FIGS. 3a-3c demonstrate how the illustrative coated substrate of FIG. 2b is made according to an example embodiment, in this case using ion sources to mill and/or plane the surface of the substrate, and using ion beam assisted deposition to deposit a capping layer on the milled and/or planed portion of the glass substrate.

FIGS. 2a and 3a show an example embodiment of a soda lime silica glass substrate 5 having a "contaminated" portion 5'. In certain example embodiments, glass substrate 5 may be from about 1 to 10 mm in thickness, and may be clear float glass or low iron glass.

An example soda-lime-silica base glass according to certain embodiments of this invention, on a weight percentage basis, includes the following basic ingredients:

TABLE 1

| Example Base Glass (Wt. %) | | | |
|---|---|---|---|
| Ingredient | Range | More Preferred | Most Preferred |
| $SiO_2$ | 67-75% | 68-74% | 69-72% |
| $Na_2O$ | 6-20% | 8-15% | 9-13% |
| CaO | 5-15% | 6-12% | 7-11% |
| MgO | 0-7% | 0-6% | 1-5% |
| $Al_2O_3$ | 0-7% | 0-2% | 0.1-0.5% |

In further example embodiments, other materials may be provided in the base glass composition.

In other example embodiments, glass substrate 5 may be low iron float glass with a thickness of from about 0.5 to 2 mm, more preferably from about 0.5 to 1.1 mm. Example low-iron glass substrates are disclosed in, for example, U.S. application Ser. No. 12/385,318, as well as in U.S. Publication Nos. 2006/0169316; 2006/0249199; 2007/0215205; 2009/0223252; 2010/0122728; and 2009/0217978, the entire contents of each of which are hereby incorporated herein by reference.

Portion 5' of the glass substrate generally contains many contaminants such as sodium (Na), calcium (Ca), magnesium (Mg), sulfates, carbonates, and the like. During the high temperature processing steps often used in the production of electronic display devices, these contaminants can sometimes migrate outward from the glass substrate into any coating located on or near the glass substrate. In certain instances, when contaminants such as these make their way into a coating, the quality and/or durability of the coating may be compromised.

An example method for ion beam milling a glass substrate prior to depositing a coating thereon is described in U.S. Pat. No. 6,777,030, which is hereby incorporated by reference.

According to certain example embodiments of this invention, a glass substrate is ion beam milled prior to or during deposition of a coating system (e.g., a capping layer) thereon. Ion beam milling functions to remove or shave off a portion of the glass substrate adjacent a surface of the glass substrate in order to smooth a surface of the substrate and/or remove/reduce nano-cracks that may have been present in the original substrate surface. In certain embodiments, following or during the ion beam milling, a coating system and/or layer is deposited on the smoothened surface of the substrate (e.g., via ion beam deposition, ion beam assisted deposition, sputtering or the like).

According to certain exemplary embodiments of this invention, ion beam milling of a substrate prior to or during deposition of a layer and/or coating system thereon enables resulting layers and/or coating systems when deposited to better adhere to the substrate.

Further, ion beam milling may also function to reduce the content of sodium (Na) and other contaminants adjacent a milled surface of a soda inclusive glass substrate (e.g., soda lime silica glass substrate), thereby reducing the potential for sodium induced corrosion on the resulting coated article. It has been advantageously found that by removing portion 5' from substrate 5, in certain example embodiments the amount of contaminants in substrate 5 may be reduced.

In certain instances, much of the ion migration occurs due to the uppermost surface portion of a glass substrate (e.g., the top 150 Angstrom surface portion of a glass substrate). It is noted that the "top" or "uppermost" surface portion does not refer to the absolute top surface of a glass substrate, but rather refers to the portion of a glass substrate extending from the absolute uppermost surface of the glass substrate (e.g., the surface of the glass substrate in contact with the atmosphere) into the interior of the glass substrate, several hundred Angstroms deep. In certain example embodiments, portion 5' is located on the side of substrate 5 opposite the tin side.

By removing the top surface portion 5' of a soda lime silica glass substrate 5, the amount of potential contaminants adjacent the surface such as alkali/alkaline ions, include Na, Ca, Mg, and sulfates and carbonates, is reduced. Therefore, in certain example embodiments, when many of the contaminants adjacent the surface are removed by milling and/or planing, fewer ions may migrate outward from the glass substrate upon exposure to high temperatures and processing conditions.

In certain example embodiments, this top portion 5' of the glass substrate 5 is removed using ion beams generated by high energy ion sources (e.g., linear ion sources). One or more ion sources may be utilized in different example embodiments. In certain example embodiments, linear and/or high energy ion source(s) produce ion beams that are used to remove a top portion 5' of glass substrate 5. This process, describe above, is called "milling" and/or "planing."

Figure 3B:
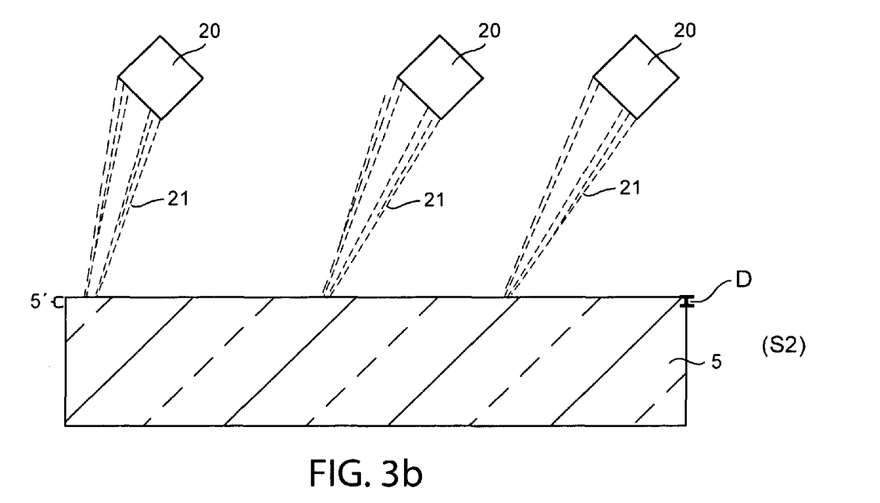

In FIG. 3b, it can be seen that the entire surface 5' of glass substrate 5 is passed under one or more linear ion beam sources 20 (preferably emitting focused ion beams, although non-focused beams may be used in certain embodiments) that extends across the entire surface 5' of the substrate in order to ion beam mill the surface 5' of substrate 5. This ion beam milling shaves off or removes a portion of the surface of the glass substrate. For example, in certain embodiments of this invention, the ion beam milling of step 101 removes from about 50-350 Angstroms (e.g., see depth "D" of shaved off glass in FIG. 3c), more preferably from about 100-300 Angstroms, and most preferably from about 150-200 Angstroms, with an example being milling and/or planing about 150 Angstroms of glass from the surface of substrate 1.

Preferably, argon (Ar) ions are used to conduct the milling of substrate 5 (e.g., Ar gas is used in the ion beam source to produce mostly Ar+ ions 21 that are directed toward the substrate surface to perform the milling) in FIG. 3b. Alternatively or additionally, other types of ions may instead be used (e.g., other inert gas ions such as Kr, Ne, and/or Xe) in the focused ion beam to perform the milling of substrate 5. In certain example embodiments, a mixture of oxygen and/or argon may be used for ions 21. At least some inert gas ions are preferred so as to reduce potential reactions with the substrate 5. The ion beam milling is preferably performed in a vacuum chamber where the ion beam source(s) and the substrate 5 being milled are located. Additionally, each ion beam source 20 is preferably operated during the ion beam milling process so that the beam has an ion energy of from about 300 to 5,000 eV, more preferably from about 1,000 to 3,000 eV, and most preferably from about 1,500 to 2,500 eV. One or more ion beam sources may be used during the milling process in different example embodiments.

Figure 4A:
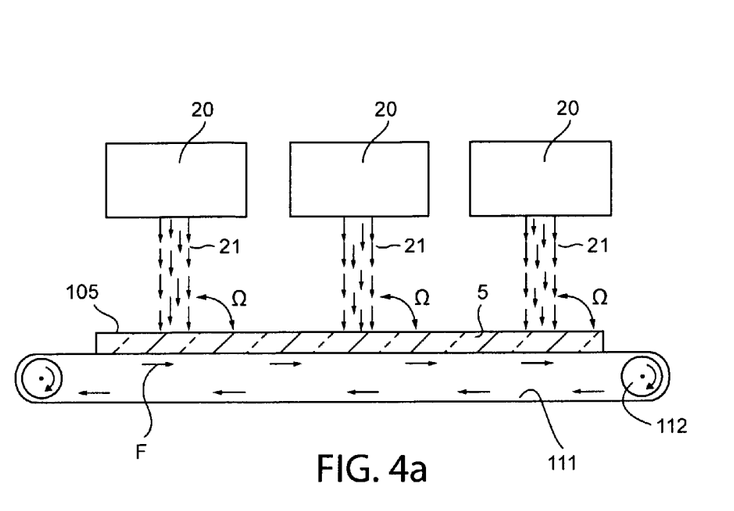
FIGS. 4(a)-(b) relate to an example ion beam milling apparatus according to certain example embodiments.
Figure 4B:
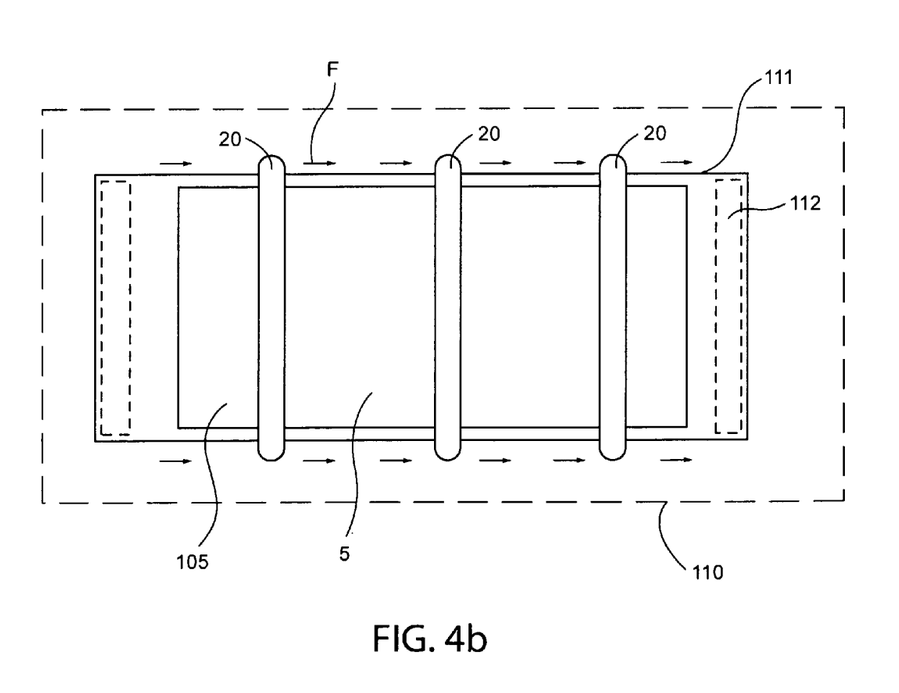

FIGS. 4(a) and 4(b) illustrate an ion beam milling apparatus provided in a vacuum chamber 110 according to certain example embodiments of this invention. An ion beam milling apparatus such as that shown in FIGS. 4(a) and 4(b) may be used in certain example embodiments relating to the process described above with respect to the ion milling and/or planing illustrated in FIG. 3b.

FIG. 4(a) is a side perspective view of the apparatus, while FIG. 4(b) is a top view of the apparatus. The ion beam milling apparatus includes conveyor 111 driven by at least one drive roll or gear 112 in order to move glass substrate(s) 5 through the apparatus in direction "F". Glass substrate 5 is on conveyor 111, and is moved through the apparatus in direction "F" so that the entire major surface 105 (major surface 105 being the uppermost top portion of surface portion 5') of the glass substrate is passed under one or a plurality of ion beam sources 20. The ion beams comprising ions 21 may be focused or non-focused, according to different example embodiments of this invention. The ion beams comprising ions 21 impinge upon surface 105 of the substrate (e.g., using Ar+ ions) thereby milling the same as discussed above. As discussed above the ion beams function to shave off a portion of the glass substrate 5 (e.g., some and/or substantially all of surface portion 5') such that in certain example embodiments, the result is a substrate having fewer contaminants such as alkali/alkaline ions and/or carbonates and sulfates near the surface thereof. Further, in certain example embodiments, the surface on which capping layer 9 (not shown in FIGS. 4(a) and 4(b)) is to be deposited may be smoother and/or have fewer nano-cracks therein.

Ion beams comprising ions 21 in FIG. 4(a) are shown hitting the surface 105 of substrate 5 at an angle Ω of approximately 90 degrees. However, in other example embodiments, ion beams comprising ions 21 may be directed at surface 105 so as to impinge upon the same at angles of from about 30-90 degrees, more preferably from about 40-60 degrees) so as to achieve more of a shaving effect (e.g., so that glass is more easily removed from the substrate by ion beams).

FIGS. 4(a) and 4(b) illustrate the use of three separate fixed ion beam sources 20. More or fewer ion sources may be used according to different example embodiments. Further, one or more ion sources may be used one or more times during the milling of a glass substrate 5. For example, the substrate 5 may pass under one or more ion beams 20 once (e.g., the substrate 5 may pass under each ion beam 20 one time), or may pass under one or more ion beams 20 more than one time. Also, in the apparatus of FIG. 4 the linear ion beam sources 20 are fixed in place so that a scan results when the entire surface of the substrate passes under the ion beam comprising ions 21. However, in alternative embodiments of this invention, a single ion beam source may be used that is capable of moving back and forth across a fixed substrate 5.

Figure 2B:
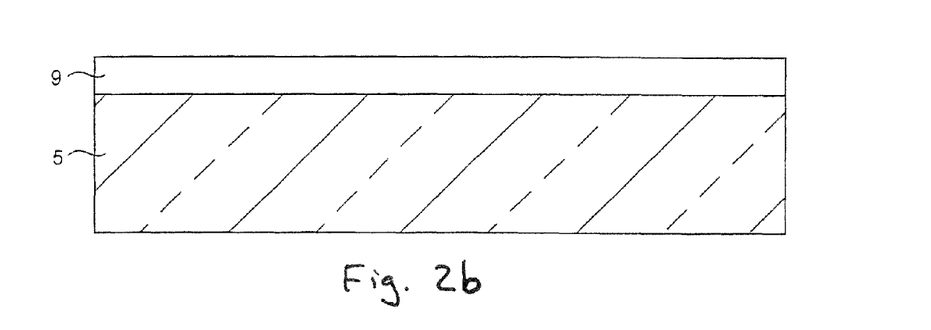
FIG. 2b is a cross-section view of a soda lime silica glass substrate with at least part of the contaminated portion substantially removed, and a capping layer deposited over the milled and/or planed portion of the glass substrate.
Figure 3C:
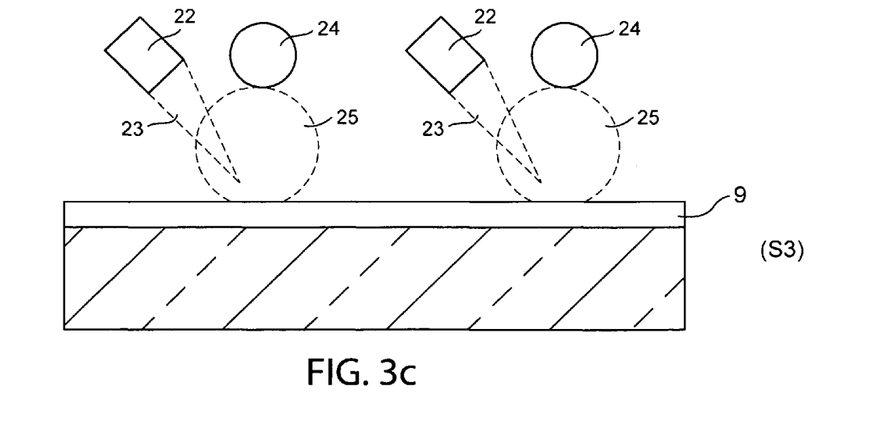

The ion sources of FIGS. 4(a) and (b) may in certain example instances be used in connection with the example embodiments shown in FIGS. 2b and 3c. FIGS. 2b and 3c show substrate 5, after portion 5' has been removed by milling and/or planing substrate 5 with ion sources. In FIG. 2b, a capping layer 9 has been deposited over the milled and/or planed portion of the glass substrate 5. FIG. 3c shows an example embodiment by which the capping layer is deposited.

In certain example embodiments, the capping layer 9 comprises aluminum silicon oxide (e.g., $AlSiO_x$). In exemplary embodiments, the capping layer has a thickness of from about 50 to 500 Angstroms, more preferably from about 100 to 400 Angstroms, and most preferably from about 200 to 300 Angstroms. In certain example embodiments, the thickness of capping layer 9 is at least as great as, or greater than the depth of the portion shaved off or removed from the surface of the glass substrate during the milling and/or planing. In other words, if the portion 5' that is removed from substrate 5 had a thickness/depth of 150 Angstroms, the thickness of layer 9 may be at least substantially equal to 150 Angstroms, and preferably greater than 150 Angstroms. In other example embodiments, however, the capping layer 9 may have a smaller thickness.

In certain example embodiments, the capping layer may comprise, or consist of, aluminum silicon oxide. Layer 9 may be stoichiometric or substoichiometric in certain example embodiments.

Layer 9 may have a refractive index of from about 1.3 to 1.6, more preferably from about 1.45 to 1.6, and most preferably layer 9 may have a refractive index of no greater than 1.55. Layer 9 may have an extinction coefficient k of about 0.

In certain example embodiments, layer 9 is deposited via ion beam assisted deposition (IBAD). Example methods of ion beam assisted deposition are described in U.S. Pat. No. 7,563,347, which is hereby incorporated by reference.

In the IBAD type of ion beam treatment, both an ion beam source(s) and a sputtering target(s) are used. An ion beam from the ion beam source (e.g., including Ar+ ions) intersects with the material sputtered from the sputtering target(s) proximate the surface where the additional or remainder portion of capping layer 9 is being grown, so that the additional or remainder portion of capping layer 9 is grown/formed by a simultaneous combination of both the ion beam and sputtering.

Figure 5:
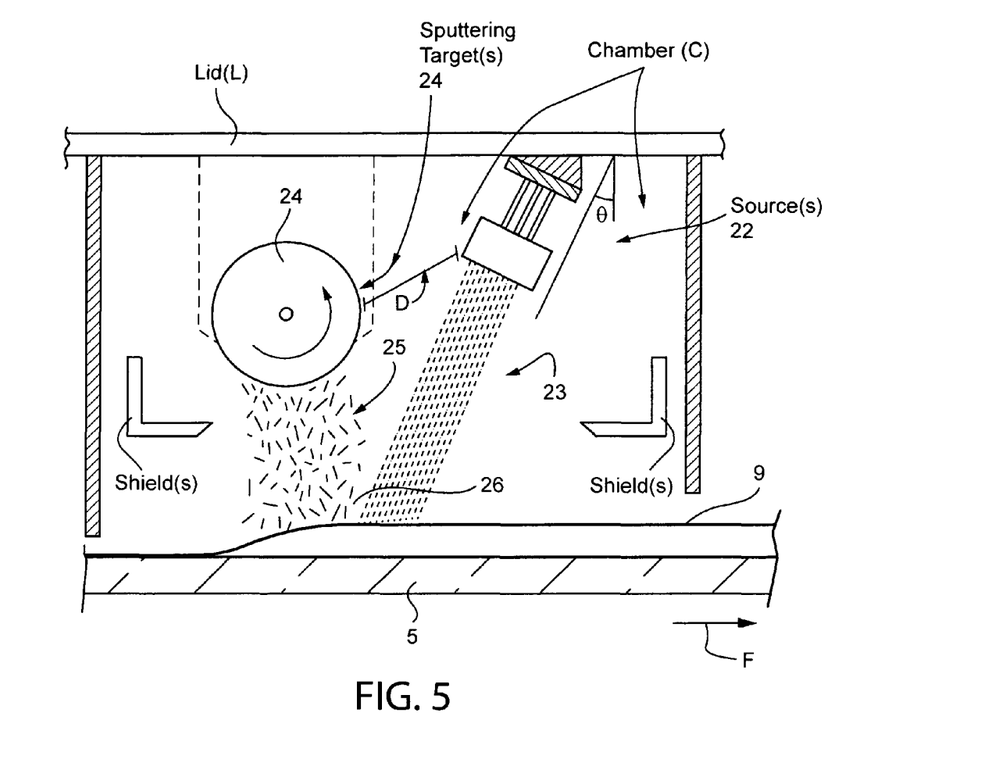
FIG. 5 illustrates an example of ion beam assisted deposition (IBAD) of layer according to certain example embodiments.

FIG. 5 illustrates ion beam assisted deposition (IBAD) of a layer according to an example embodiment of this invention. In certain example embodiments of this invention, a sputtering target(s) 24 and an ion source(s) 22 are located in the same deposition chamber (C) (which may or may not be a vacuum in different example embodiments) so that they are at approximately the same pressure (e.g., at a pressure less than atmospheric pressure). In certain example embodiments, a lid (L) of a deposition chamber supports both a sputtering target(s) 24 (e.g., a planar target and/or a rotatable CMAG target) and at least one ion source 22. This permits sputtering and ion beam treatment to take place in the same deposition chamber at approximately the same pressure and/or gas atmosphere. Space can also be saved in this respect. Shield (S) helps to reduce stray target material landing on the substrate prematurely and/or at the wrong time. Shield(s) (S) may or may not be used in certain example embodiments of this invention.

The use of both a sputtering target(s) and an ion beam source(s) in the same chamber can be used in forming any suitable layer (e.g., a Si inclusive layer, or any other suitable type of layer) of various types of coatings on substrates. For purposes of example, such a structure with both (an) ion source(s) and a sputtering target(s) supported by the same lid of a deposition chamber, and/or both located in the same chamber at approximately the same pressure, can be used in any of the example embodiments discussed herein. For example, such a structure can be used in embodiments for peening a layer, in IBAD embodiments where the layer is formed using IBAD, and/or in embodiments involving a layer which is first sputter-deposited, and thereafter subjected to ion beam treatment discussed herein. In certain example embodiments, the distance between the target(s) and the ion beam source(s) D and/or the angle θ can be adjusted so as to control the degree and position of overlap between target material 25 and ion beams comprising ions 23. Though FIG. 5 does not depict an overlap of target material and ion beams prior to deposition, by increasing θ, such overlap may occur just above substrate 5 in region 26.

Figure 6:
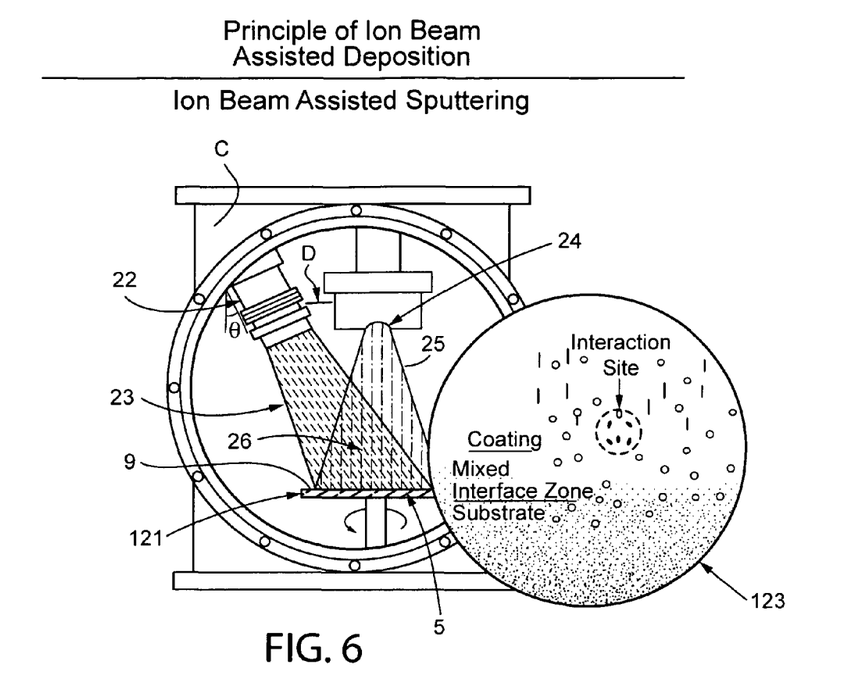
FIG. 6 is a diagram illustrating example principles of ion beam assisted deposition (IBAD) according to certain example embodiments.

FIG. 6 illustrates further example principles of IBAD, and illustrates an example embodiment in which there is significant overlap between target material 25 and ion beams comprising ions 23 in the region 26. Rotating substrate holder 121 in FIG. 6 holds and/or rotates the substrate during the formation of layer 9 via IBAD. FIG. 6 further includes atomic scale view 123 of the IBAD.

In peening embodiments, the ion beam treatment is performed after the layer has been originally deposited by sputter-deposition or the like. In certain IBAD embodiments, sputtering and ion beam treatment may take place at the same time for layer formation and/or treatment. In certain example, instances, IBAD and peening embodiments may be combined.

The example principles of FIGS. 5 and/or 6 may be used in connection with the example embodiments shown and described in connection with FIG. 3c. FIG. 3c illustrates that in the IBAD type of ion beam treatment/formation, both an ion beam source(s) 22 and a sputtering device including a sputtering target(s) 24 may be used. In certain example embodiments, an ion beam comprising ions 23 from the ion beam source 22 intersects with the material 25 sputtered from the sputtering target(s) 24 proximate the surface of substrate 5 where the additional or remainder portion of capping layer 9 is being grown, so that the additional or remainder portion of capping layer 9 is grown/formed by a simultaneous combination of both the ion beam and sputtering. In certain example embodiments of this invention, a Si and/or Al-inclusive sputtering target may be used for sputter-depositing the capping layer, and at least one ion beam source comprising argon ions is also used. However, the invention is not so limited, and other types of ions such as krypton, xenon, and the like, may be used instead. It is noted that a layer that is grown using IBAD may contain particles from the gases used in the ion sources.

In certain example embodiments, the deposition environment may include one sputtering apparatus (e.g., a cathode) and one ion source. In other example embodiments, more than one sputtering apparatus and/or ion source may be used. In further example embodiments, more than one type of each device may be used.

In an exemplary example embodiment, capping layer 9 may be deposited using a single rotary SiAl cathode and cold cathode, and a closed drift linear ion source. Oxygen, argon, krypton, and/or xenon may be used as ions in the ion source and/or may be fed through the gas distribution system in different example embodiments. In certain example embodiments, a mixture of argon and oxygen gases may be used. For example, argon may be introduced into the ion source, and oxygen may be fed through the gas distribution system. In some instances, when a layer is deposited in this manner, the layer may end up having small amounts of argon in addition to the other sputtering materials and oxygen.

In certain example embodiments, the use of IBAD is particularly advantageous in that it creates a much denser film than can otherwise be made with different deposition techniques (e.g., traditional magnetron sputtering). However, other techniques may be used according to different example embodiments of this invention.

Figure 7:
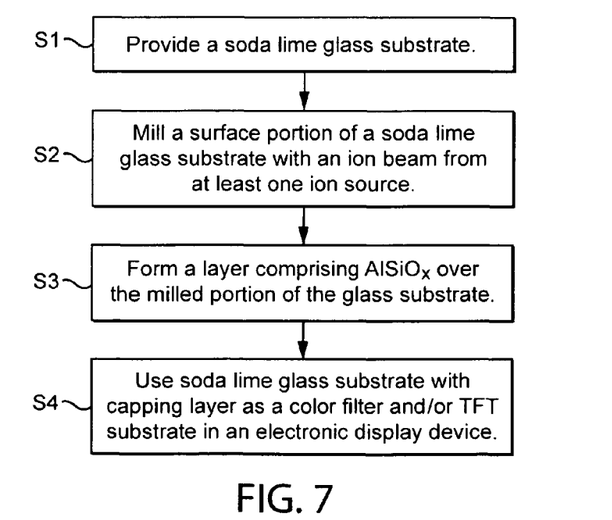
FIG. 7 is a flowchart showing an illustrative process corresponding to FIGS. 3a-3c for making an electronic device including a surface-treated soda lime silica glass substrate as the color filter and/or TFT substrate in accordance with example embodiments of the invention.

FIG. 7 shows an exemplary method for performing the surface treatment of a soda lime silica glass substrate described herein. First, in Step 1 (S1), a soda lime silica glass substrate is provided. In Step 2 (S2), a surface portion of the soda lime silica glass substrate is milled and/or planed using ion beam(s) from one or more ion sources. In Step 3 (S3), a layer comprising AlSiOx is formed over the milled and/or planed portion of the glass substrate. In S3, this layer is formed using ion beam assisted deposition, whereby an ion beam from the ion beam source (e.g., including Ar+ ions) intersects with the material sputtered from the sputtering target(s) proximate the surface where the additional or remainder portion of capping layer is being grown, so that the additional or remainder portion of capping layer is grown/formed by a simultaneous combination of both the ion beam and sputtering. In Step 4 (S4), the soda lime silica glass substrate with at least the capping layer thereon is used as a color filter and/or TFT substrate in an electronic display device.

Figure 8:
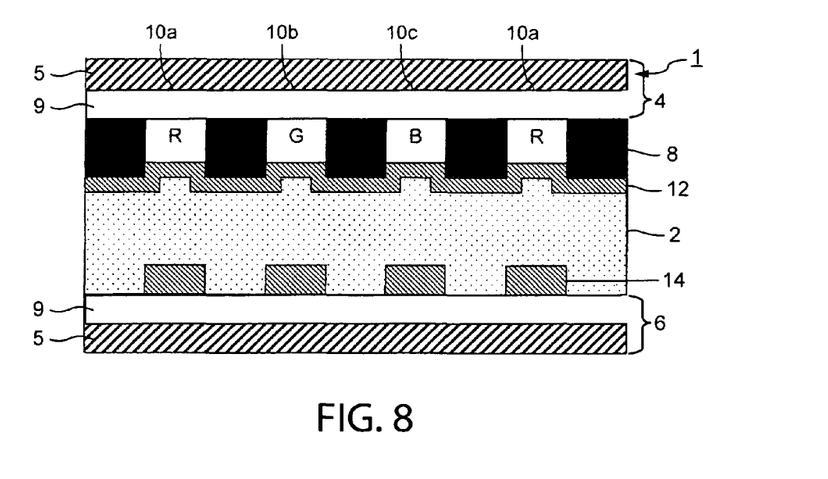
FIG. 8 is a cross-sectional view of an LCD display device incorporating an ion beam-milled glass substrate with a layer deposited by ion beam assisted deposition thereon as the color filter and/or TFT substrate in an LCD display device.

FIG. 8 illustrates an example LCD display device incorporating milled and/or planed glass substrate 5 with layer 9 thereon. Glass substrate 5 with capping layer 9 thereon may be used as color filter substrate 4 and/or TFT substrate 6 in an LCD display device, as shown in FIG. 8, in certain example embodiments of this invention.

Treating a glass substrate according to the methods described herein may advantageously result in a glass substrate that is suitable for use in an electronic display device (e.g., an LCD) without compromising the quality and/or durability of that device.

In certain exemplary embodiments of this invention, ion beam milling may function to reduce the content of sodium, other alkali/alkaline ions, and other contaminants adjacent a milled surface of a soda lime silica inclusive glass substrate. In certain embodiments, many of the potential contaminants that migrate out of glass substrates into coatings provided thereon are located in a top portion near the surface of a glass substrate. Removing this top portion of the surface of a glass substrate therefore may reduce the likely presence of (and sometimes even completely eliminate) many potential contaminants from the glass substrate, in certain example embodiments. In certain examples, this milling may thereby reduce the potential for sodium (and other contaminant)-induced corrosion and other damage to the resulting coated article because of the migration of sodium and/or other contaminants from the glass substrate outward into the coating as a result of the high temperatures and/or processing steps often involved in making electronic devices. Other contaminants such as sulfates and carbonates may cause damage to the coatings and/or layers in proximity to the substrate as well. These effects can be particularly detrimental in electronic devices. Therefore, in certain example embodiments, by removing this top portion of the surface of a glass substrate, the potential for damage to the coatings/coated articles during processing is reduced.

Moreover, by depositing a capping layer over the milled and/or planed portion, the migration of many of any contaminants remaining after milling and/or planing will be reduced and/or impeded. It has advantageously been found that by using IBAD, a much denser layer can be formed. In certain example embodiments, this increased density may contribute to the decrease in migration of contaminants from the glass into any layers and/or coatings near the glass substrate. Layers with a greater density may in certain embodiments permit fewer particles to move through the layer and penetrate other layers.

In certain example embodiments, forming capping layer 9 over the milled portion of a glass substrate via ion beam assisted deposition may further reduce the migration of contaminants from the glass substrate into the coating. In certain example embodiments, IBAD helps to create a layer that is denser than if formed through traditional sputtering methods, or even through ion beam deposition (e.g., using an ion source without also using a sputtering target). Therefore, it will be appreciated that the combination of milling from about 100 to 300 Angstroms of glass off of the surface of a soda lime silica glass substrate, and further forming a capping layer over the milled portion via IBAD has surprisingly been found to significantly reduce the migration of contaminants into a coating, and thereby may render soda lime silica glass substrates suitable for use in electronic display devices. Other example advantages include better adherence between capping layer 9 and the surface of glass substrate 5, and greater smoothness of the surface of glass substrate 5 after said surface has been subjected to milling.

Further examples of U.S patents describing ion beam milling and/or ion beam assisted deposition are U.S. Pat. Nos. 7,049,003; 7,183,559; 7,198,699; 7,229,533; 7,311,975; 7,387,816; 7,405,411; 7,445,273; 7,550,067; 7,566,481; 7,563,347; 7,585,396; 7,641,978 and 7,622,161, all of which are hereby incorporated by reference. Further examples of U.S Patent Publications describing ion beam milling and/or ion beam assisted deposition are 2005/0178652; 2006/0269661; 2008/0226926; 2009/0226714; 2009/0263667; 2010/0032287; 2010/0075155; and 2010/0075157, all of which are hereby incorporated by reference.

In certain example embodiments, when soda lime silica glass, is treated according to the methods described herein, a soda lime silica-based glass substrate may be used in display devices such as LCDs rather than the alumina borosilicate glass currently used in the LCD industry. This is advantageous in that soda lime silica glass is less expensive than borosilicate glass, and in some cases soda lime silica glass is almost half the price of borosilicate glass (per square foot). Therefore, it can be seen that these methods of surface treatment are particularly advantageous.

Furthermore, in certain example embodiments, mass production of glass substrates suitable for use as color filter and/or TFT substrates advantageously may be achieved. In certain example embodiments, due to the increasing size of display devices, it would be advantageous to have a larger glass substrate suitable for use as a color filter and/or TFT glass substrate in an electronic display device. Soda lime silica glass substrates may be more commercially available and/or more economical in larger sizes than borosilicate glass substrates, thereby permitting larger display devices to be made.

In certain example embodiments, the ion beam planing or milling and the deposition of the capping layer may result in at least about 75%, more preferably at least about 90%, more preferably at least about 95%, and still more preferably at least about 99%, of alkali and alkaline ions, and sulfates, carbonates being prevented from migrating from the substrate into any functional layers of the device as compared to a situation where the substrate is not ion beam planed or milled and where the capping layer is not deposited.

In some instances, other layer(s) below, within, or above the illustrated layer 9 may also be provided. Thus, while the layer system or coating is "on" or "supported by" substrate 5 (directly or indirectly), other layer(s) may be provided therebetween. Thus, for example, the individual layers described herein may be considered "on" and "supported by" the substrate 5 even if other layer(s) are provided between the particular layer and the substrate 5. Moreover, layer 9 may be removed in certain embodiments, and other layers may be added in other embodiments of this invention without departing from the overall spirit of certain embodiments of this invention.

Coated articles according to different embodiments of this invention may or may not be heat treated (HT) in different instances. The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes. In certain example embodiments, the heat treatment may be performed prior to milling the glass substrate, after milling the glass substrate but prior to depositing any layers, and/or after the glass substrate has been milled and some or all of the layers have been deposited. The glass substrate/coated article also may be compacted and/or re-annealed in other example embodiments.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a display device, the method comprising:
    ion beam milling substantially an entire surface of a glass substrate using at least a first ion source, so as to reduce the thickness of the glass substrate by at least about 100 Angstroms, wherein the glass substrate comprises from about 67-75% $SiO_2$, about 6-20% $Na_2O$, and about 5-15% CaO;
    forming a coated article by depositing only a single layer comprising aluminum silicon oxide directly on and contacting the ion beam milled surface of the glass substrate via ion beam assisted deposition (IBAD), during or following said ion beam milling, wherein said IBAD uses at least one sputtering target and at least a second ion source; and
    making a TFT substrate for the display device by employing the coated article as a base of the TFT substrate, so that the layer comprising aluminum silicon oxide is located between TFTs and the glass substrate.

2. The method of claim 1, wherein the layer comprising aluminum silicon oxide, is deposited from an Al and Si inclusive target.

3. The method of claim 2, wherein the layer comprising aluminum silicon oxide, has a thickness of from about 200 to 300 Angstroms.

4. The method of claim 1, wherein the layer comprising aluminum silicon oxide, has an index of refraction of no greater than about 1.55.

5. The method of claim 4, wherein the layer comprising aluminum silicon oxide, has an optical extinction coefficient k of about 0.

6. The method of claim 1, wherein said ion beam milling reduces the thickness of the glass substrate by from about 150 to 250 Angstroms.

7. The method of claim 1, wherein the thickness of the layer comprising aluminum silicon oxide is substantially the same as the thickness by which the glass substrate was reduced as a result of said ion beam milling.

8. The method of claim 1, wherein the thickness of the layer comprising aluminum silicon oxide, is greater than the thickness by which the glass substrate was reduced as a result said ion beam milling.

9. The method of claim 1, wherein the IBAD involves argon ions.

10. The method of claim 1, wherein the glass substrate is a soda lime silica low iron glass substrate.

11. The method of claim 1, further comprising:
    providing a color filter substrate; and
    disposing a layer of liquid crystal material between the color filter substrate and the TFT substrate.

12. The method of claim 1, wherein said milling is performed in an Ar and $O_2$ inclusive gaeous environment.

13. The method of claim 1, wherein said ion beam milling and the deposition of the layer comprising aluminum silicon oxide result in at least about 90% of alkali and alkaline ions, and sulfates, carbonates being prevented from migrating from the glass substrate into any functional layers of the device as compared to a situation where the glass substrate is not ion beam milled and where the layer is not deposited.

14. The method of claim 1, wherein said ion beam milling and the deposition of the layer comprising aluminum silicon oxide result in at least about 95% of alkali and alkaline ions, and sulfates, carbonates in the glass substrate being prevented from migrating from the glass substrate into any functional layers of the device.

* * * * *